(12) United States Patent
Chan et al.

(10) Patent No.: US 7,078,773 B2
(45) Date of Patent: Jul. 18, 2006

(54) NITRIDE-ENCAPSULATED FET (NNCFET)

(75) Inventors: Kevin K. Chan, Staten Island, NY (US); Hussein I. Hanafi, Basking Ridge, NJ (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/328,258

(22) Filed: Dec. 23, 2002

(65) Prior Publication Data

US 2004/0119115 A1    Jun. 24, 2004

(51) Int. Cl.
*H01L 29/76*  (2006.01)
*H01L 29/94*  (2006.01)
*H01L 31/062*  (2006.01)
*H01L 31/113*  (2006.01)
*H01L 31/119*  (2006.01)

(52) U.S. Cl. .................................................. 257/365
(58) Field of Classification Search ................ 257/365, 257/366

See application file for complete search history.

(56) References Cited

U.S. PATENT DOCUMENTS

| 5,140,391 | A |   | 8/1992 | Hayashi et al. |
| 5,188,973 | A |   | 2/1993 | Omura et al. |
| 5,349,228 | A |   | 9/1994 | Neudeck et al. |
| 5,773,331 | A |   | 6/1998 | Solomon et al. |
| 6,096,582 | A | * | 8/2000 | Inoue et al. ............ 438/149 |
| 6,399,451 | B1 | * | 6/2002 | Lim et al. ............... 438/303 |
| 6,417,570 | B1 | * | 7/2002 | Ma et al. ................ 257/760 |
| 6,946,696 | B1 | * | 9/2005 | Chan et al. .............. 257/250 |
| 2001/0010380 | A1 | * | 8/2001 | Maeda .................... 257/365 |

FOREIGN PATENT DOCUMENTS

| JP | 05-048100 | * | 2/1993 | ............ 257/365 |
| JP | 08-064827 |   | 3/1996 | |

OTHER PUBLICATIONS

Sung, J. M. et al., "Reverse L-Shape Sealed Poly-Buffer LOCOS Technology." IEEE Electron Device Letters vol. 11, No. 11 p. 549-551 (1990).

Lee, Jong-Wook et al., "Effects of Buried Oxide Thickness on Electrical Characteristics of LOCOS-Isolated Thin-Film SOI MOSFETs." IEEE International SOI Conference p. 73-74 (1998).

Woodruff, R. L. et al., "A Differential-Height-Mess Buried Body Tie SOI Process." IEEE p. 148-149 (1991).

* cited by examiner

*Primary Examiner*—Howard Weiss
(74) *Attorney, Agent, or Firm*—Scully, Scott, Murphy & Presser, P.C.; Wan Yee Cheung, Esq.

(57) ABSTRACT

A double-gate field effect transistor (DGFET) structure and method of forming such a structure in which the parasitic capacitance under the source/drain regions is substantially reduced are provided. In the present invention, self-aligned isolation regions are provided to reduce the parasitic capacitance in the DGFET structure. Additionally, the present invention encapsulates the silicon-containing channel layer to enable the back-gate to be oxidized to a greater extent thereby reducing the parasitic capacitance of the structure even further.

9 Claims, 5 Drawing Sheets

NITRIDE-ENCAPSULATED FET (NNCFET)

FIELD OF THE INVENTION

The present invention relates to double-gate field effect transistors (DGFETs), and in particular to DGFETs that include self-aligned isolation regions. The present invention is also directed to a method of fabricating DGFETs having the aforementioned features using nitride or another like protective material to encapsulate the Si-containing channel during formation of the self-aligned isolation regions.

BACKGROUND OF THE INVENTION

In order to make integrated circuits (ICs) such as memory, logic and other devices, of higher integration density than currently feasible, one has to find a means to further scale down the FET devices that are present therein. Moreover, as FET dimensions are scaled down, it becomes increasingly difficult to control short-channel effects by conventional means. Short-channel effects, as well known to those skilled in the art, are the decrease in threshold voltage, $V_t$, in short-channel devices, i.e., sub-0.1 micron, due to two-dimensional electrostatic charge sharing between the gate and the source/drain regions.

An evolution beyond the standard single gate metal oxide semiconductor field effect transistor (MOSFET) is the double-gate MOSFET, where the device channel is confined between top and bottom gate dielectric layers. This structure, with a symmetrical gate structure, can be scaled to about half of the channel length as compared to a conventional single gate MOSFET structure. It is well known that a dual gate or double-gate MOSFET device has several advantages over conventional single gate MOSFET devices. Specifically, the advantages for dual gate MOSFET devices over their single gate counterparts include: a higher transconductance, lower parasitic capacitance, and improved short-channel effects. For instance, Monte-Carlo simulation has been previously carried out on a 30 nm channel dual gate MOSFET device and has shown that the dual gate device has a very high transconductance (2300 mS/mm) and fast switching speeds (1.1 ps for nMOSFET).

Moreover, improved short-channel characteristics are obtained down to 20 nm channel length with no doping needed in the channel region. This circumvents the tunneling breakdown, dopant quantization, and dopant depletion problems associated with channel doping that are normally present with single gate MOSFET devices.

Some examples of prior art double-gate MOSFETs are found in the following references:

U.S. Pat. No. 5,188,973 describes a double-gate structure in which the bottom gate is not self-aligned to the top gate. This prior art double-gate structure is quite different from the inventive double-gate structure described herein because the inventive DGFET includes self-aligned isolation oxide regions that are formed while the Si channel region is encapsulated with nitride. No such self-aligned oxide isolation regions and encapslation is disclosed in the '973 patent.

U.S. Pat. Nos. 5,140,391 and 5,349,228 describe other types of double-gate structures. In these prior art double-gate structures, the Si channel region is not encapsulated with nitride during formation of oxide isolation regions. Moreover, these prior art structures do not include self-aligned oxide isolation regions.

To date, prior art methods for fabricating double-gate MOSFETs have either been very complex or have severe drawbacks in terms of parameter control. Moreover, some of the structures known in the art have large parasitic capacitance between the back-gate and the source/drain regions. This can be reduced by increasing the back-gate dielectric thickness, but with the penalty of reduction of back-gate control, and poorer scaling properties. When low capacitance is desired, the back-gate dielectric should be approximately 20× thicker than the front gate dielectric, but when greater effective control is desired, the back-gate dielectric should be approximately 2–4× thicker than the front gate.

Co-assigned U.S. Pat. No. 5,773,331 describes a structure and method for fabricating a double-gate MOSFET structure in which the above problems have been solved. In particular, the '331 patent describes a double-gate MOSFET having sidewall source and drain contacts and bottom and top gate oxides that are self-aligned. The structure disclosed in the '331 patent has low parasitic capacitance to the bottom gate and a reduced drain and source resistance as compared to other prior art double-gate MOSFETs.

In the '331 patent, the double-gate MOSFET having the above-mentioned characteristics is obtained by the steps of: forming a channel layer; forming a top gate insulator layer on the channel layer; forming a top gate on the top gate insulator; forming a gate pillar on the top gate; forming insulating sidewall layers adjacent to the top gate and the gate pillar; forming an integral source/drain region within the channel layer by introduction of dopants; forming conductive amorphous sidewalls on either side of, and adjacent to the insulating sidewall layers, one of the amorphous silicon sidewalls being connected to the drain region and the other being connected to the source region; and etching the channel layer using the top gate, gate pillar, insulating sidewall layers and amorphous silicon sidewalls as a mask, thereby transferring the lateral extension of the mask into the channel layer, providing for a channel with integral source/drain regions being raised with respect to the support structure.

Despite being capable of providing self-aligned top and bottom gates, the prior art double-gate MOSFET disclosed in the '331 patent does not provide self-aligned oxide isolation regions and complete nitride encapsulation of the Si channel region. As such, the '331 patent does not provide a DGFET which has its lowest possible parasitic capacitance.

SUMMARY OF THE INVENTION

The present invention provides a DGFET and method for forming such a structure in which the parasitic capacitance under the source/drain regions is substantially reduced. In the present invention, self-aligned isolation regions are provided to reduce the parasitic capacitance in the DGFET structure. Additionally, the present invention encapsulates the Si-containing channel to enable the back-gate to be oxidized to a greater extent thereby reducing the parasitic capacitance of the structure even further. The term "Si-containing" is used throughout the specification to indicate a semiconducting material that includes Si. Illustrative examples of such Si-containing materials include Si, SiGe, SiC, SiGeC and other like Si-containing semiconductors.

It has been determined by the applicants of the present invention that protecting the sidewalls of the Si-containing region with a nitride or another like protective material eliminates the problem of sidewall oxidation of the channel, which typically occurs in the absence of encapsulation. In addition, it has been determined that the nitride layer under the back-gate dielectric blocks oxidation of the Si-containing channel from the bottom. Following oxidation and formation of the self-aligned isolation regions, the protective material, e.g., nitride, from the sidewalls of the Si-containing channel is removed so as to expose an edge of the Si-containing channel that can be extended by means of Si-containing overgrowth forming Si-containing regions atop the self-aligned isolation region. The Si-containing regions can be implanted forming extended source/drain regions therein and a silicide may be formed atop the extended source/drain regions.

The DGFET of the present invention, which has substantially reduced parasitic capacitance, comprises:

a doped back-plane region having isolation regions located adjacent thereto;

a back-gate dielectric stack including at least a bottom back-gate nitride located atop a surface portion of said doped back-plane region not containing said isolation regions;

a Si-containing layer having edges located atop said back-gate dielectric stack, each of said Si-containing edges including a source/drain region;

a front gate dielectric located atop portions of said Si-containing layer;

a front gate located atop said front gate dielectric; and

Si-containing regions located adjacent to said front gate and over said isolation regions, said Si-containing regions being in contact with said source/drain regions.

In a preferred embodiment of the present invention, the isolation regions are self-aligned with the front gate.

The present invention also provides a method of fabricating the above-mentioned DGFET. Specifically, the method of the present invention comprises the steps of:

providing a structure which includes at least a doped back-plane region, a back-gate dielectric stack including at least a bottom back-gate nitride formed atop said doped back-plane region, a Si-containing layer having edges formed atop said back-gate dielectric stack, a front gate dielectric formed atop said Si-containing layer, and a front gate formed atop said front gate dielectric, said structure having isolation trench regions adjacent to at least said doped back-plane region;

forming insulating spacers on exposed vertical sidewalls of said front gate;

forming protective spacers on said structure about said insulating spacers and covering said edges of said Si-containing layer;

forming isolation regions in regions of said structure which are adjacent to, and overlaying a portion of said doped back-plane region, whereby said protective spacers and said bottom back-gate nitride protect said Si-containing layer from oxidizing;

removing said protective spacers exposing said edges of said Si-containing layer; and selectively growing Si-containing regions above and in contact with said edges.

The method of the present invention further includes forming extended source/drain regions in portions of the Si-containing regions as well as forming silicide regions over the extended source/drain regions.

DETAILED DESCRIPTION OF THE INVENTION

Figure 1:
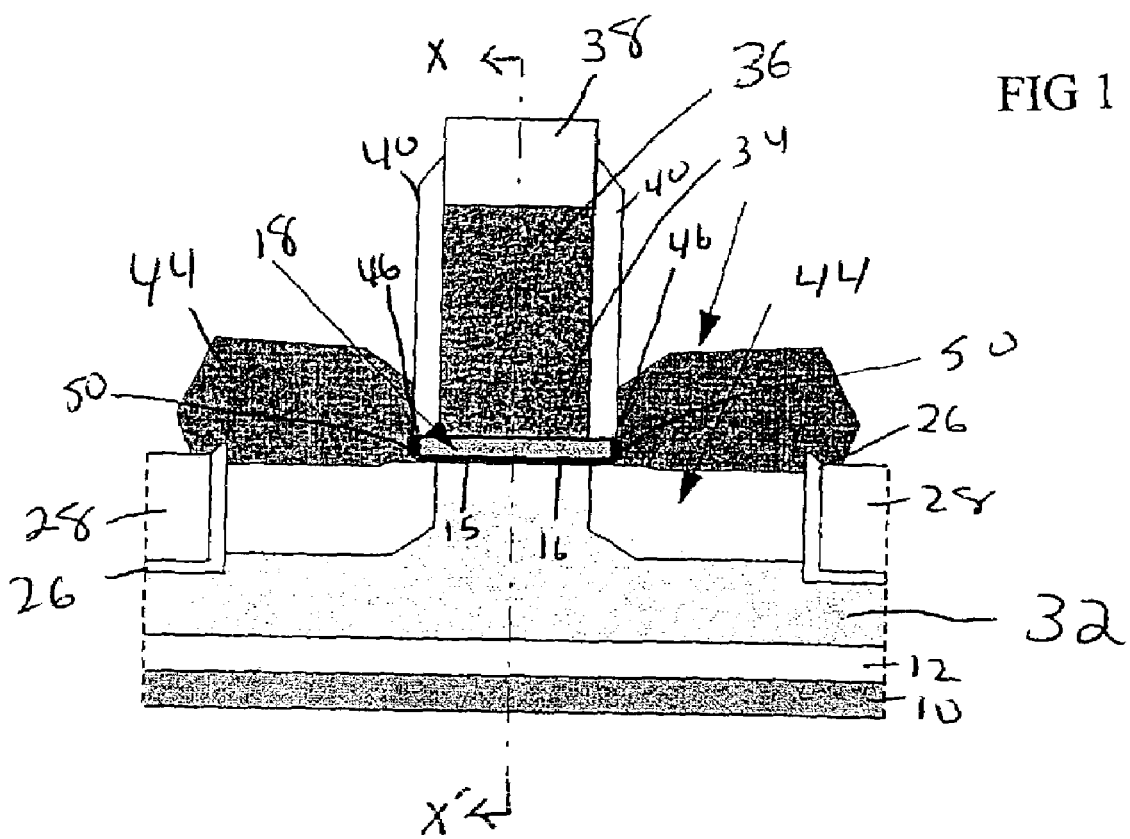
FIG. 1 is a pictorial representation (through a cross-sectional view) showing the DGFET of the present invention which includes self-aligned isolation regions and a Si-containing channel region that is encapsulated with protective material.

The present invention, which provides self-aligned isolation DGFETs and a method of fabricating the same, will now be described in more detail by referring to the drawings that accompany the present application. It is noted that in the drawings and description that follows an NFET having a P-doped back-plane is described. Although such a structure is shown and described, the present invention contemplates a structure having the opposite polarity, i.e., a PFET having an N-doped back-plane. The structure having the opposite polarity is fabricated by changing the dopant species described herein below to the opposite polarity.

FIG. 1 illustrates a cross-sectional view of the self-aligned isolation DGFET of the present invention. Specifically, the self-aligned isolated DGFET of the present invention includes doped back-plane region 32 having isolation regions 44 located adjacent thereto as well as atop portions of the doped back-plane region 32. The structure illustrated in FIG. 1 further includes a back-gate dielectric stack including a back-gate nitride 15 and a back-gate dielectric 16 located atop a surface portion of the doped back-plane region 32 and Si-containing layer 18 (which is the thin body region of the DGFET of the present invention) having edges 46 located atop the back-gate dielectric 16. As shown, each of the edges 46 includes source/drain regions 50. The DGFET of the present invention also includes patterned gate electrode 36 and patterned mask 38 located atop the front gate dielectric. The patterned mask is removed after the structure shown in FIG. 1 is fabricated and the exposed patterned gate electrode is implanted forming the front gate of the DGFET of the present invention. Insulating spacers 40 are positioned on vertical sidewalls of the front gate as well as surface portions of Si-containing layer 18.

Figure 2A:
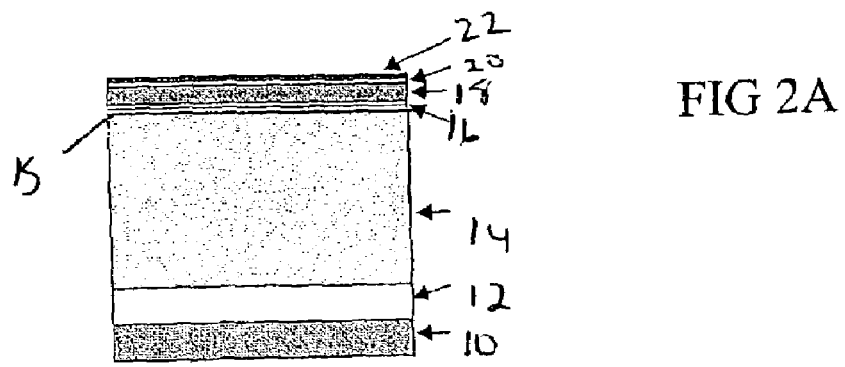
FIGS. 2A–2O are pictorial representations (through cross-sectional views) illustrating the basic processing steps that are employed in the present invention in fabricating the DGFET structure shown in FIG. 1.

The other components shown and labeled in FIG. 1, not specifically mentioned herein above, will be described in greater detail in FIGS. 2A–2O. FIGS. 2A–2N are representative of the structure shown to the left of plane X–X'. FIG. 2O shows the structure of FIG. 1 after further processing steps are performed.

The method of forming the self-aligned isolated DGFET of the present invention shown in FIG. 1 will now be described in more detail by referring to FIGS. 2A–2N. As stated above, FIG. 2O shows the structure of FIG. 1 after further processing steps have been performed. Reference is first made to FIG. 2A which illustrates a cross-sectional view of an initial stack structure that can be employed in the present invention. Specifically, the initial stack structure shown in FIG. 2A includes a handle wafer 10, a bottom insulator 12 located atop the handle wafer 10, a polysilicon back-plane region 14 located atop the bottom insulator 12, a back-gate nitride 15 located atop the polysilicon back-plane 14, a back-gate dielectric 16 located atop the back-gate nitride 15, a Si-containing layer 18 located atop the back-gate dielectric 16, a pad oxide 20 located atop the Si-containing layer 18, and a polish stop layer 22 located atop the pad oxide 20.

The structure illustrated in FIG. 2A may be fabricated, in some embodiments, by first providing a transfer wafer (not shown) that includes the Si-containing layer 18 formed on a surface of the transfer wafer. The transfer wafers used at this point of the present invention may be a bulk Si wafer or other types of semiconductor wafers including silicon-on-insulators may be used. The Si-containing layer may include any of the above mentioned silicon materials, with preference given to Si. When Si is employed as the Si-containing layer, the Si layer may be amorphous, single crystal or polycrystalline, with preference given to single crystal Si since such a material provides high performance devices. In some embodiments, the Si-containing layer is part of the transfer wafer; either an SOI layer of an SOI transfer wafer, where the buried oxide is used as the etch stop, or just the top layer of a bulk silicon wafer.

The Si-containing layer 18 is formed by a conventional deposition process including, for example, chemical vapor deposition (CVD), plasma-assisted CVD, evaporation or chemical solution deposition. The Si-containing layer 18 may have any thickness when it is first applied to the transfer wafer. Typically, the Si-containing layer 18 has an initial thickness of from about 50 to about 500 nm, which may be thinned after performing a subsequent bonding process.

The back-gate nitride 15 is then formed atop the Si-containing layer 18 by utilizing a conventional deposition process or, alternatively, the back-gate nitride 15 may be formed by a thermal growing process. The thickness of the back-gate nitride 15 may vary, but typically, the back-gate nitride 15 has a thickness of from about 1 to about 5 nm.

Next, the back-gate dielectric 16 is formed atop the back-gate nitride 15 utilizing a conventional deposition process such as CVD. Alternatively, the back-gate dielectric 16 may be formed by a thermal processing step. The back-gate dielectric 16 may be composed of an oxide or oxynitride, with preference given to oxide dielectrics. Suitable examples of oxides that can be employed as the back-gate dielectric 16 include, but are not limited to: $SiO_2$, $Al_2O_3$, $ZrO_2$, $HfO_2$, $Ta_2O_3$, $TiO_2$, perovskite-type oxides and combinations and multilayers thereof. The thickness of the back-gate dielectric 16 may vary, but typically, the back-gate dielectric 16 has a thickness of from about 2 to about 20 nm.

The polysilicon back-plane region 14 is then formed atop the back-gate dielectric 16 utilizing a conventional deposition process such as CVD. The polysilicon back-plane region 14 has a thickness of from about 50 to about 500 nm. Next, the bottom insulator 12 is formed atop the polysilicon back-plane 14 utilizing a conventional deposition process or a conventional thermal growing process. The bottom insulator 12 may be an oxide, nitride or oxynitride, with preference given to oxides such as $SiO_2$. The thickness of the bottom insulator 12 may vary, but typically the bottom insulator 12 has a thickness of from about 100 to about 400 nm.

After the transfer wafer containing layers 18, 16, 15, 14, and 12 is provided, the exposed surface of the bottom insulator 12 is bonded to the handle wafer 10 using a conventional bonding process that is well known to those skilled in the art. After bonding, the transfer wafer is removed from the bonded structure leaving the Si-containing layer 18 exposed. Specifically, the transfer wafer may be removed by grinding and etching. During the grinding and etching process, the Si-containing layer 18 may be thinned to a thickness of less than 20 nm. A portion of this thinned Si-containing layer 18 is used in the present invention as the body region of the DGFET.

After the removal of the transfer wafer and thinning of the Si-containing layer 18, the pad oxide 20 is formed atop the thinned Si-containing layer 18 by utilizing a conventional deposition process or by utilizing a conventional thermal oxidation process. Notwithstanding which technique is employed, the pad oxide 20 typically has a thickness of from about 2 to about 10 nm, with a thickness of from about 3 to about 5 nm being more highly preferred.

The polish stop layer 22, which may be composed of a nitride and/or oxynitride, is then formed atop the pad oxide 20 utilizing a conventional deposition process well known to those skilled in the art. The thickness of the polish stop layer 22 may vary and is of no significant importance to the present invention.

The above description provides one means for providing the initial structure shown in FIG. 2A. Other means are also contemplated herein. Also, in some embodiments, it is possible to provide an initial structure that does not include the bottom insulator 12. Moreover, in some embodiments, it is possible that the polysilicon back plane region 14 may be part of the handle wafer 10, in which case it would be formed from single crystal Si rather than polycrystalline Si.

Figure 2B:
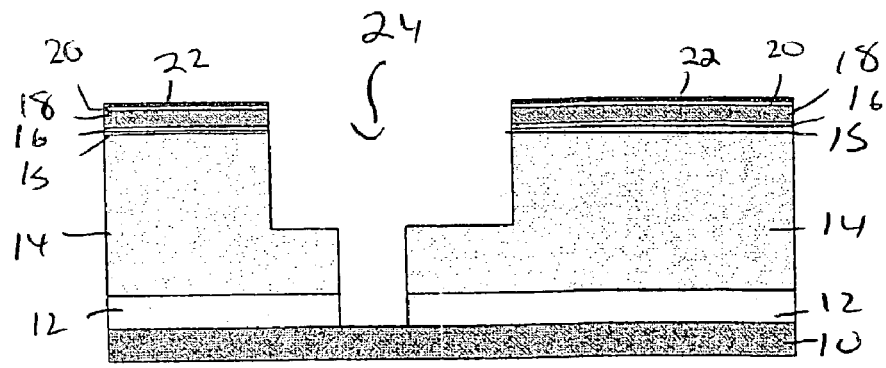

After forming the initial structure shown in FIG. 2A, an isolation trench opening 24 having a wide upper region (i.e., shallow trench opening) and a narrow lower region (i.e., deep trench opening) is formed into the initial structure providing the structure shown, for example, in FIG. 2B. At least one other like isolation trench opening 24 would be formed in the structure to the right of that which is shown. The isolation trench opening 24 is formed as follows: First, a conventional photoresist (not shown) is applied to the surface of the polish stop layer 22 utilizing a deposition process such as CVD and spin-coating. The photoresist is then patterned by conventional lithography (including exposure and development) to contain a pattern for fabricating the shallow trench opening. With the patterned photoresist (not shown) in place, an etching process such as reactive-ion etching (RIE), ion beam etching, or plasma etching is employed to transfer the shallow trench pattern into the initial structure shown in FIG. 2A. During this etching process, exposed portions of the polish stop layer 22, the pad oxide 20, the Si-containing layer 18, the back-gate dielectric 16, and the back-gate nitride 15 are removed stopping within the polysilicon back-plane region 14.

Following the etching step, the patterned photoresist is removed utilizing a conventional stripping process, and a second photoresist (not shown) is applied and patterned by lithography to include a deep trench pattern. The deep trench pattern is then transferred into the previously etched structure by etching through exposed portions of the polysilicon back-plane region 14 and the bottom insulator 12 stopping atop an upper surface of the handle wafer 10. Following the transfer of the deep trench pattern into the structure, the second photoresist is removed utilizing a conventional stripping process.

Figure 2C:
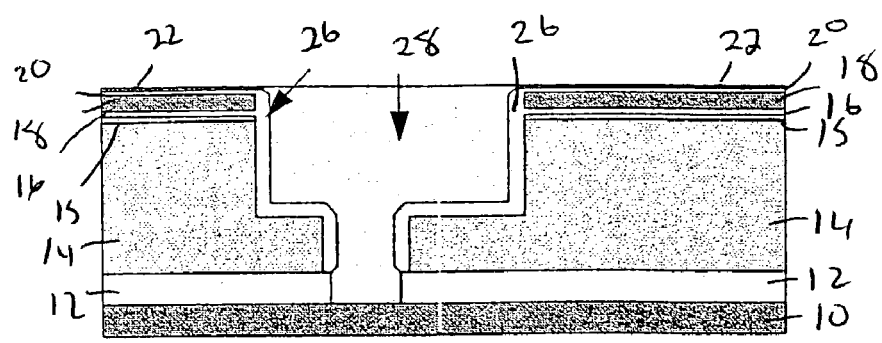

After forming the isolation trench opening 24 into the structure, a trench oxide liner 26 is formed via a thermal oxidation process so as to cover at least the exposed sidewalls of the Si-containing layer 18 and the polysilicon back-plane region 14. The isolation trench opening 24 containing trench oxide liner 26 is then filled with dielectric trench material 28 such as a CVD oxide or tetraethylorthosilicate (TEOS) and planarized to the polish stop layer 22 providing the planar structure shown, for example, in FIG. 2C. The isolation trench region including the trench fill material 28 and the trench oxide liner 26 shown in FIG. 2C separates the polysilicon back-plane region 14 into two distinct regions. A second isolation trench region, not shown, would be located on the right hand side of the drawing.

A first implantation mask (not shown) is then formed on portions of the structure, and thereafter ions of a first conductivity type, e.g., N or P, are ion implanted into the polysilicon back-plane region of the structure which does not include the first implantation mask. The first implantation mask is removed and a second implantation mask covering at least the previously ion implanted region is then formed. After forming the second implantation mask, ions of a second conductivity type, e.g., N or P, which differ from the first conductivity type are ion implanted into polysilicon back-plane region not containing the second implantation mask. The dosage of the ions used during these implantations may vary and may be optimized depending on the type of device being formed. After the second ion implantation process, the second ion implantation mask is removed and then the structure is subjected to an annealing process which is performed utilizing conditions that activate and drive the dopant ions upward through each polysilicon back-plane region until the region is uniformly doped. In the present invention, this annealing is typically performed in an inert gas ambient at a temperature of about 950° C. or greater for a time period of from about 30 minutes or less.

Figure 2D:
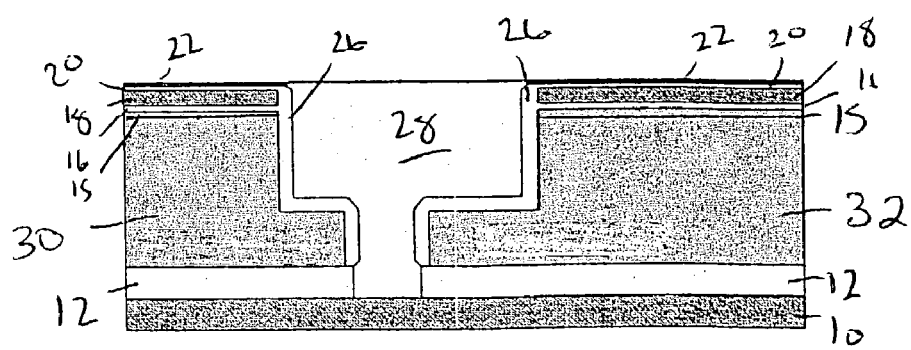

FIG. 2D illustrates the structure that is formed after the various implants and annealing process mentioned above have been performed. In the drawing, reference numeral 30 denotes an N-doped polysilicon back-plane region, whereas reference numeral 32 denotes a P-doped polysilicon back-plane region. The dopant concentration of regions 30 and 32 may vary, but typically N-doped back-plane region 30 has a dopant concentration of about 1E19 atoms/cm$^3$ or greater, with a dopant concentration about 5E19 atoms/cm$^3$ being more highly preferred. In the case of P-doped back-plane region 32, that region typically has a dopant concentration of about 1E19 atoms/cm$^3$ or greater, with a dopant concentration of about 5E19 atoms/cm$^3$ being more highly preferred. Some of the doped back-plane regions serve as the bottom gate electrode, i.e., the back-gate, of the DGFET of the present invention.

After forming the doped back-plane regions, the polish stop layer 22 is removed from the structure utilizing an etching process that is selective in removing the polish stop material as compared to oxide. This etching step of the present invention removes the polish stop layer 22 from the structure and exposes the underlying pad oxide 20. For example, phosphoric acid can be used in selectively removing the polish stop layer 22 from the structure. After the polish stop layer 22 has been removed from the structure, the exposed pad oxide layer, i.e., layer 20, is selectively removed so as to expose the Si-containing layer 18. Any conventional etching process that is selective in removing oxide as compared to Si can be employed. For example, dilute hydrofluoric acid can be used in selectively removing the pad oxide layer 20 from the structure.

After the pad oxide layer 20 has been selectively removed, a front (or top) gate dielectric 34 is formed atop the exposed surfaces of the Si-containing layer 18. The front gate dielectric 34 may be composed of the same or different dielectric material as the back-gate dielectric 16 as well as nitrides. Moreover, the front gate dielectric 34 may be formed utilizing any conventional deposition process such as CVD. The thickness of the front gate dielectric 34 may vary, but typically the front gate dielectric 34 has a thickness of from about 1 to about 5 nm.

A gate electrode material such as polysilicon, a conductive metal, a silicide, or any combination thereof, including multilayers is formed atop the structure utilizing a conventional deposition process and then a mask material such as an oxide or nitride or oxynitride is formed via a conventional deposition process atop the gate electrode material. The preferred material for the gate electrode is polysilicon.

Figure 2E:
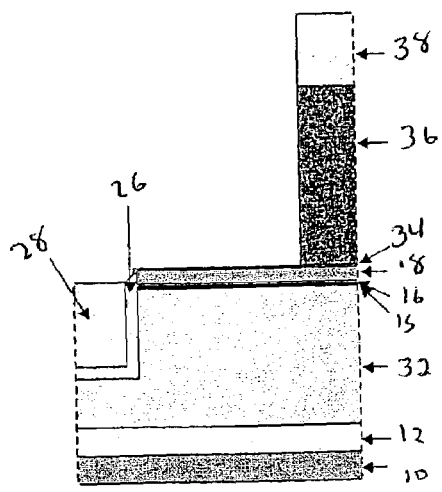

The mask and the gate electrode material are then patterned providing a patterned gate electrode 36 and a patterned mask 38 atop a portion of the front gate dielectric 34 that lies atop the P-doped back-plane region 32. The patterning is achieved utilizing a patterned resist mask (not shown) and etching. The resultant structure including the front gate dielectric 34, the patterned gate electrode 36 and the patterned mask 38 is shown, for example, in FIG. 2E. In this drawing, and the remaining drawings, only a portion of the trench isolation region is now shown.

Figure 2F:
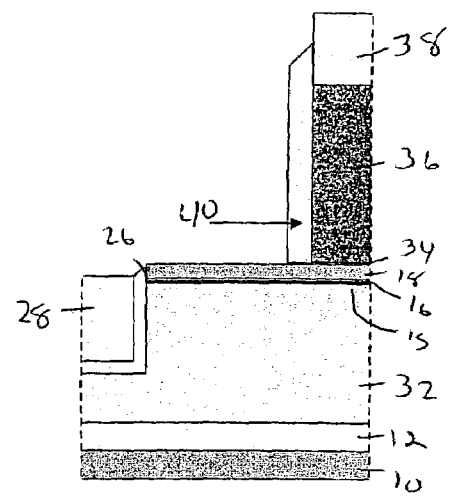

Insulating spacers 40 are formed atop portions of the front gate dielectric 34 as well as the exposed sidewalls of at least the patterned gate electrode material 36 and a portion of the patterned mask 38. The insulating spacers 40 are composed of an insulating material including, for example, silicon dioxide, which can withstand a silicon nitride etch. The insulating spacers 40 are formed by deposition of an insulating material and etching. These spacers typically have a lateral thickness of from about 0.5 to about 3 nm, with a lateral thickness of from about 1 to about 2 nm being more highly preferred. The structure that is formed after the above steps have been performed is shown, for example, in FIG. 2F.

Figure 2G:
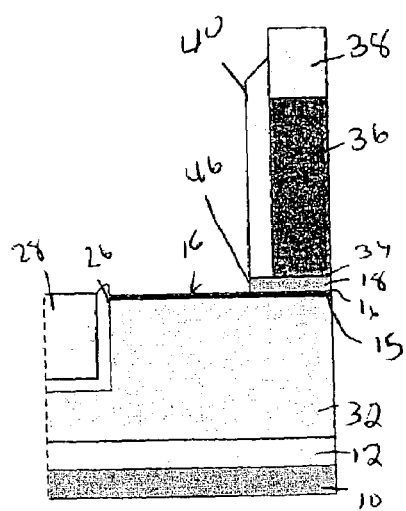

FIG. 2G shows the structure after the exposed portions of the front gate dielectric 34 and the Si-containing layer 18, which are not protected by the insulating spacers 40, are removed stopping on a surface of the back-gate dielectric 16. The structure shown in FIG. 2G is formed utilizing a selective etching process such as RIE. Si-containing layer 18 now has an edge 46.

In an optional embodiment (not shown), the exposed edges 46 of the Si-containing layer 18 may be implanted with source/drain implants at this point of the present invention. If performed at this stage of the process, an angled ion implantation process is used in forming the source/drain regions in the Si-containing layer 18.

Figure 2H:
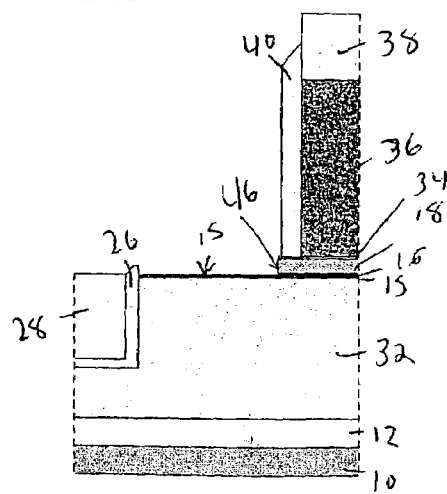

Next, the exposed portions of the back-gate dielectric 16 are removed stopping atop a surface of the back-gate nitride 15. Portions of the back-gate dielectric 16 are removed at this point of the present invention utilizing a selective etching process such as a chemical wet etch that is selective against removing nitride. The resultant structure after this etching process has been performed is shown, for example, in FIG. 2H. It is also within the contemplation of the present invention to form the source/drain regions into the exposed edges 46 of the Si-containing layer 18 at this point of the present invention. In such an instance, an angled ion implantation process may be employed.

Figure 2I:
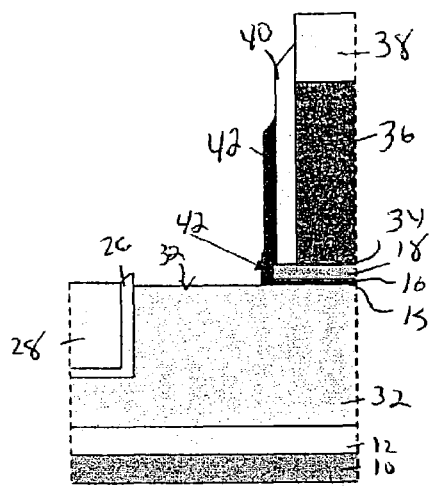

FIG. 2I shows the structure that is formed after protective spacers 42 are formed on the sidewalls of the back-gate nitride 15, the Si-containing layer 18, the front-gate dielectric 34 and the insulating spacers 40. The protective spacers 42 are formed by a deposition process, followed by etching. During the etching process, exposed lateral portions of the back-gate nitride 15 are removed so as to expose the underlying doped back-plane region 32. The protective spacers 42 together with the remaining back-gate nitride 15 seal the Si-containing layer 18; the Si-containing layer 18 is encapsulated by protective material, e.g., nitride, from the bottom and sides while encapsulated from the top by layers 36 and 38. The protective spacers are formed of a material, such as a nitride, that prevents Si-containing layer 18 from being oxidized by a subsequent oxidation step.

Figure 2J:
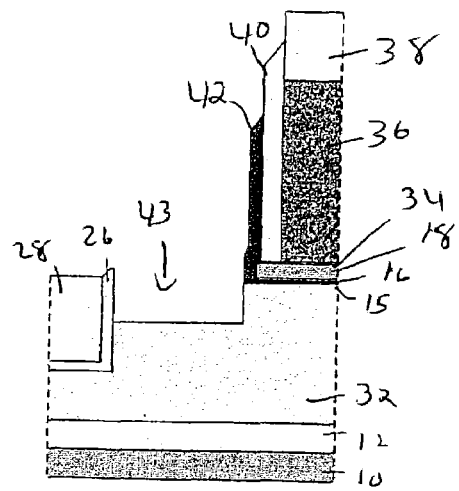

After formation of the protective spacers 42, the structure shown in FIG. 2I is subjected to an etching process that recesses a portion of the exposed doped back-plane region 32 providing the structure, shown, for example, in FIG. 2J. The recessed opening formed in the structure is labeled as 43 in the drawing. The recess opening 43 may or may not remove the trench liner 26 from the structure, but this is not important since a new oxide layer 44 is subsequently added.

Figure 2K:
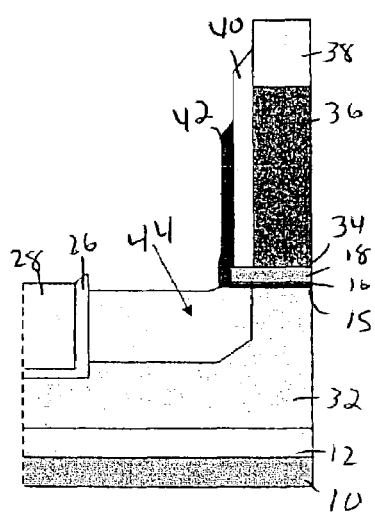
Figure 2L:
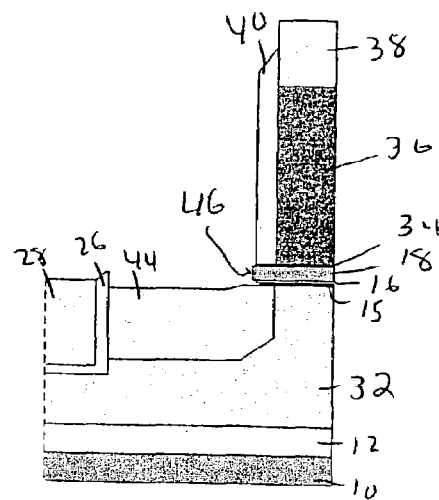

FIG. 2K shows the structure that is formed after subjecting the structure shown in FIG. 2J, to a thermal oxidation process. As shown, the resultant structure following the thermal oxidation process contains self-aligned isolation regions 44. The self-aligned isolation regions 44 are oxide isolation regions. A portion of self-aligned isolation regions 44 extends under the Si-containing layer 18 and is self-aligned with an edge of the patterned gate electrode 36. No loss of the Si-containing layer 18 occurs during this step since the Si-containing layer 18 is encapsulated (on the side and on the bottom) by protective material, e.g., nitride.

After formation of the self-aligned isolation region 44, the spacers 42 as well as a portion of the back-gate nitride 15 which previously contained the spacers 42 are removed from the structure utilizing an etching process that is selective in removing nitride. The removal of the protective material from the structure again exposes the edges 46 of Si-containing layer 18. The amount of over etch should be controlled so as not to undercut the nitride all the way to the recessed back-gate.

Figure 2M:
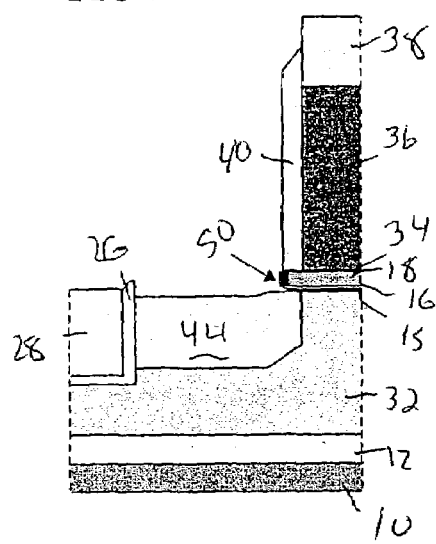
Figure 2N:
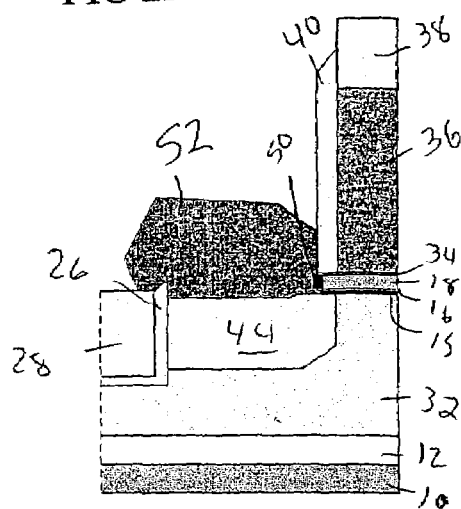
Figure 2O:
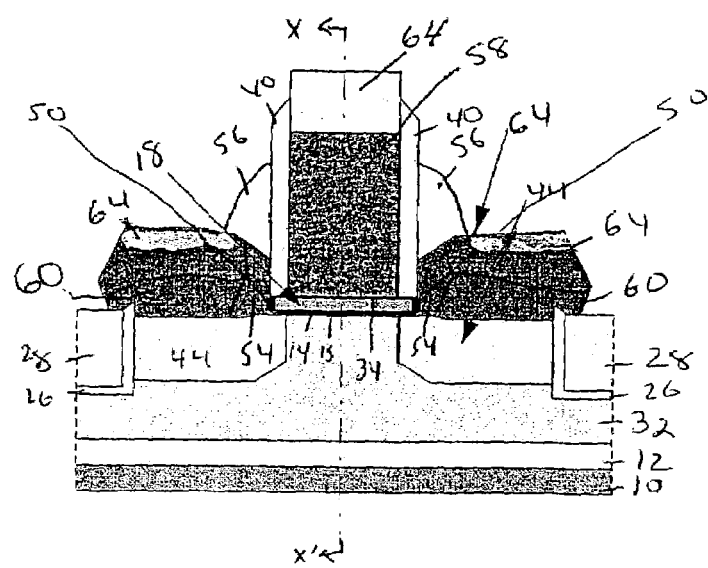

If not previously formed, source/drain regions 50 may now be formed into the exposed edges 46 utilizing an angled ion implantation process. The exposed edges 46 containing the source/drain regions 50 serve as a seed region to grow a Si-containing region. The resultant structure that is formed after the above processing steps have been performed is illustrated in FIG. 2M.

FIG. 2N illustrates the resultant structure that is formed after source/drain contact regions 52 are formed. The contact regions 52 are formed using a selective lateral epi overgrowth process wherein a Si-containing region is grown. The source/drain contact regions 52 are formed from the edges 46 of the Si-containing layer 18 containing the source/drain regions 50. The contact regions 52 are in contact with at least the vertical edge of each insulating spacer 40 and are formed atop portions of the self-aligned isolation regions 44.

Following formation of the contact regions 52, a resist mask (not shown) is formed atop portions of the structure which overlays the N-doped back-plane region 30, and extended source/drain regions 54 are formed in the exposed regions of the contact regions 52 utilizing a shallow ion implantation process. The shallow implantation process is required to ensure that the dopants are not implanted into portions of the Si-containing layer 18 that serve as the channel of the DGFET of the present invention. The above steps of resist blocking and ion implantation can be used in forming the implants for the PFET (not shown).

Spacers 56 are then formed atop the extended source/drain regions 54 utilizing conventional deposition and etching. Note that portions of the spacers 56 are into contact with exposed vertical surfaces of the insulating spacers 40. The mask 38 located atop the patterned gate electrode 36 is then removed.

A resist mask (not shown) is then formed atop portions of the structure and the exposed portions of the self-aligned isolation regions 44 formed atop the doped back-plane regions are removed utilizing a selective etching process such as RIE. After the selective etching process has been performed, the resist mask mentioned above is stripped from the structure.

Another resist mask (not shown) is formed, and then deep implants of an N-type dopant are performed into portions of the exposed N-doped back-plane region 30, portions of exposed epi-Si source/drain contact region 52, and portions of the gate electrode 36. In FIG. 2O, reference numeral 58 denotes N-gate region, and reference numeral 60 denotes outer N-source/drain regions. The outer N-doped source/drain regions 60 are in contact with the inner source/drain regions formed in the edges 46 of the Si-containing layer 18 through the extended source/drain regions 54. The N-doped back-plane contact region is not shown. The resist is removed and the above steps are repeated in the P-FET region of the structure.

FIG. 2O also shows the structure that is formed after siliciding exposed portions of regions 58 and 60 as well as the N-doped back-plane contact region. The silicide regions denoted by reference numeral 64 are formed utilizing a conventional silicidation process which includes applying a refractory metal such as Ti or Co atop regions 58 and 60 and the N-doped back-plane contact, annealing the structure to cause formation of silicides in areas containing refractory metal and removing any non-reacted refractory metal from the structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A double-gate field effect transistor (DGFET) comprising:
    a doped back-plane region having thermal oxide isolation regions located adjacent to said doped back-plane and atop a portion of the doped back-plane;
    a back-gate dielectric stack including at least a bottom back-gate nitride located atop a surface portion of said doped back-plane region not containing said thermal oxide isolation regions;
    a Si-containing layer having edges located atop said back-gate dielectric stack, each of said Si-containing edges including a source/drain region, wherein said edges of the Si-containing layer are essentially free of sidewall oxide;
    a front gate dielectric located atop portions of said Si-containing layer;
    a front gate located atop said front gate dielectric; and
    Si-containing regions located adjacent to said front gate and over said thermal oxide isolation regions, said Si-containing regions are in contact with said source/drain regions, wherein said thermal oxide regions are aligned to a vertical edge of the front gate and are not connected to each other in a region beneath said front gate.

2. The DGFET of claim 1 wherein said Si-containing regions include outer source/drain regions, extended source/drain regions and a silicide located atop said outer source/drain regions, said outer source/drain regions are connected to said source/drain regions through said extended source/drain regions.

3. The DGFET of claim 1 further comprising a silicide located atop said front gate.

4. The DGFET of claim 1 wherein said doped back-plane region comprises P-polysilicon and said front gate is an NFET or said doped back-plane region comprises N-polysilicon and said front gate is a PFET.

5. The DGFET of claim 1 wherein said doped back-plane region is located atop a bottom insulator, said bottom insulator being positioned atop a handle wafer.

6. The DGFET of claim 1 wherein a portion of said back-gate dielectric stack and said front gate dielectric are both oxides.

7. The DGFET of claim 1 wherein said front gate is comprised of polysilicon.

8. The DGFET of claim 1 wherein a portion of said Si-containing layer underneath said front gate serves as a body region of the DGFET.

9. The DGFET of claim 1 further comprising isolation trench regions adjacent to said thermal oxide isolation regions.

* * * * *